(12) United States Patent
Furukawa (10) Patent No.: US 6,511,794 B1
(45) Date of Patent: Jan. 28, 2003

(54) METHOD OF FORMING RESIST PATTERN, AND EXPOSURE DEVICE

(75) Inventor: Takamitsu Furukawa, Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 122 days.

(21) Appl. No.: 09/664,003

(22) Filed: Sep. 18, 2000

(30) Foreign Application Priority Data

Mar. 27, 2000 (JP) ........................................ 2000-085788

(51) Int. Cl.$^7$ ................................................ G03F 7/20

(52) U.S. Cl. ........................ 430/328; 430/322; 430/330; 430/394

(58) Field of Search ................................ 430/311, 322, 430/328, 330, 394

(56) References Cited

U.S. PATENT DOCUMENTS 5,648,198 A * 7/1997 Shibata ........................ 430/296
2001/0007732 A1 * 7/2001 Iwasaki ........................ 430/5

FOREIGN PATENT DOCUMENTS

JP 11-119443 4/1999

* cited by examiner

*Primary Examiner*—Kathleen Duda
(74) *Attorney, Agent, or Firm*—Venable; James R. Burdett (57) ABSTRACT

A method of forming a resist pattern and an exposure device using the method are provided in which a relatively large pattern, whose dimension is greater than a resolution limit of a KrF exposure technique, and an extremely fine pattern, whose dimension is less than or equal to the resolution limit of the KrF exposure technique, can be formed well and simultaneously. Two patterns are exposed simultaneously by deep UV light of a wavelength of 248 nm on a resist film 10 formed of TDUR-P015 and formed on a surface of an $SiO_2$ film 12. The two patterns are: a circular pattern of a dimension which is made larger, in accordance with a shrinkage rate, than a finally required pattern dimension, which circular pattern is formed at regions to be shrunk; and a circular pattern of a dimension which is finally required, which circular pattern is formed at regions not to be shrunk. A UV light exposure amount, which is of an amount such that heat resistance of the TDUR-P015 forming the resist film 10 improves and the resist pattern does not shrink, is applied only onto the regions not to be shrunk of the resist pattern obtained by development. Then, high temperature bake processing at 135° C. for 60 seconds is carried out.

20 Claims, 10 Drawing Sheets

SMALL　　　　STANDARD DIMENSION

F I G. 6 B

CORRECTION
EXPOSURE　HIGH ← NO CORRECTION
AMOUNT

F I G. 6 C

SMALL　　　　STANDARD DIMENSION

SMALL    STANDARD DIMENSION

FIG. 8B

TRANSMISSION    LARGE    ← 0
RATE

FIG. 8C

SMALL    STANDARD DIMENSION

FIG. 10A
PRIOR ART

BEFORE BAKING  0.5 μm

FIG. 10B
PRIOR ART

AFTER BAKING AT 135°C FOR 60 SECONDS  0.35 μm

METHOD OF FORMING RESIST PATTERN, AND EXPOSURE DEVICE

BACKGROUND OF THE INVENTION

1. Field of the Invention

The present invention relates to a method of forming a resist pattern and to an exposure device, and in particular, to a method of forming a resist pattern and an exposure device which are based on an exposure technique using a KrF excimer laser as a light source in the production of a semiconductor integrated circuit.

2. Description of the Related Art

Conventionally, in manufacturing a semiconductor integrated circuit, in order to form a finer pattern, a KrF exposure technique has been mainly used, in which deep UV light having a wavelength of 248 nm is emitted as exposure light from a KrF excimer laser light source. In this KrF exposure technique, it is possible to form a patter of about 0.2 μm.

Japanese Patent Application Laid-Open (JP-A) No. 11-119443 discloses, in such a KrF exposure technique, a technique in which a fine pattern of about 0.2 μm or less is obtained by shrinking the resist pattern (e.g., shrinking the internal diameter of the hole pattern formed at the resist) by baking the resist at a temperature which is higher than the usual baking which is carried out in order to remove the residual solvent and the residual moisture which remain after the resist pattern has been formed. In accordance with this technique, it is possible to form a pattern of about 0.1 μm or less, which exceeds the resolution limit of the KrF exposure technique.

The method disclosed in the aforementioned JP-A-11-119443 is suited to the formation of an extremely fine pattern for which the size (dimension) of a feature (e.g., the diameter of a contact hole, the width of an embedded wiring, or the like) is less than or equal to the resolution limit of the KrF exposure technique. However, for a relatively large pattern whose feature dimension is greater than the resolution limit of the KrF exposure technique, the pattern after baking deteriorates, and thus, this method is not preferable.

Figure 10A:
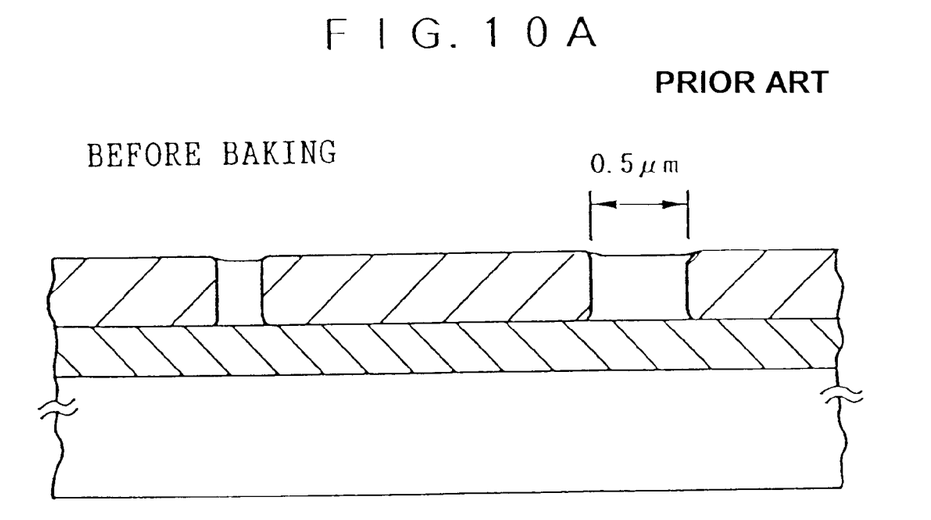
FIG. 10A is a diagram illustrating the configuration of a resist before high temperature bake processing, and is for explaining the deterioration in the configuration of a resist pattern in a case in which a contact hole pattern, which is of a dimension which is less than or equal to an exposure resolution, and a contact hole pattern, which is of a dimension which is greater than the exposure resolution, are formed simultaneously by a conventional method of forming a resist pattern.
Figure 10B:
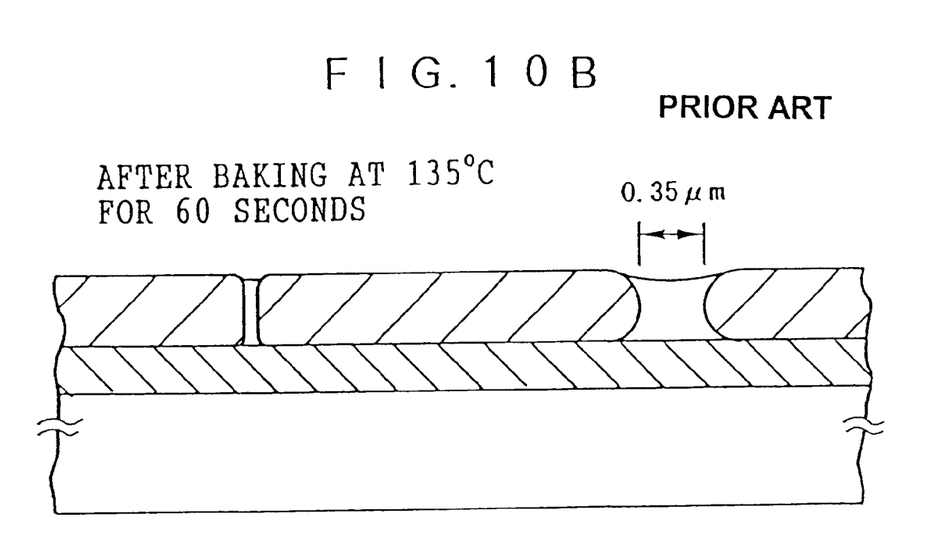
FIG. 10B is a diagram illustrating the configuration of a resist after high temperature bake processing at 135° C. for 60 seconds, and is for explaining the deterioration in the configuration of a resist pattern in a case in which a contact hole pattern, which is of a dimension which is less than or equal to a dimension limited by an exposure resolution, and a contact hole pattern, which is of a dimension which is greater than the dimension limited by the exposure resolution, are formed simultaneously by a conventional method of forming a resist pattern.

For example, as illustrated in FIG. 10A, when holes (a contact hole pattern) of a diameter of about 0.25 μm and holes (a contact hole pattern) of a diameter of about 0.5 μm are formed in a resist and the resist is baked for 60 seconds at around 135° C., as illustrated in FIG. 10B, the side walls at the holes (the contact hole pattern) of a diameter of about 0.25 μm do not deform and only the diameter decreases such that holes of a diameter of about 0.1 μm are formed. However, at the holes (the contact hole pattern) having a diameter of about 0.5 μm, the resist side walls forming the pattern curve towards the centers of the holes, such that deformed holes whose smallest diameter is 0.35 μm are formed.

When a resist having holes of such configurations is used as a mask in the etching process which is carried out later, the portions corresponding to the peaks of the convex shapes of the resist are gradually removed as the film to be processed, which is the layer therebeneath, is etched. In addition, the resist side walls are curved toward the centers of the holes and the smallest diameter thereat is 0.35 μm. Therefore, considering that the diameter of the bottom surface of the hole which is nearer to the surface of the film to be processed is greater than 0.35 μm and that the film to be processed can be somewhat side-etched at the border region at the time of etching, a hole of a diameter much larger than the desired diameter is formed in the film to be processed. This tendency becomes marked particularly when the diameter of the resist pattern before baking is greater than 0.5 μm.

SUMMARY OF THE INVENTION

In view of the aforementioned, an object of the present invention is to provide a method of forming a resist pattern in which a relatively large pattern, whose feature dimension is greater than the resolution limit of the KrF exposure technique, and an extremely fine pattern, whose feature dimension is less than or equal to the resolution limit of the KrF exposure technique, can be formed well simultaneously.

In order to achieve the above object, an aspect of the present invention is a method for forming a resist pattern including the steps of: subjecting a resist, which is applied on a surface of an object to be processed, to pattern exposure in which a first exposure amount for forming a pattern is applied to the resist; forming a resist pattern by developing the resist; subjecting the resist pattern to a second exposure in which a second exposure amount, which adjusts a shrinkage rate of the resist pattern, is applied to the resist pattern; and subjecting the resist to a bake process at a temperature at which the resist flows.

Namely, for a resist pattern formed on an object to be processed, the heat resistance of the resist is changed by carrying out an exposure which applies a second exposure amount. The heat resistance of the resist affects the shrinkage rate of the resist pattern at the time of high temperature bake processing. The greater the heat resistance, the lower the shrinkage rate. Because the heat resistance of the resist varies in accordance with the second exposure amount, in the first aspect of the present invention, the shrinkage rate of the resist pattern at the time of high temperature bake processing is adjusted by adjusting the second exposure amount.

Namely, a heat resistance of the resist is desired which is such that the shrinkage rate of the resist pattern is a predetermined shrinkage rate. By applying the amount of exposure, which results in this heat resistance, as the second exposure amount, the shrinkage rate of the resist pattern is adjusted, and the resist pattern can be shrunk to a desired dimension.

Control may be carried out such that second exposure amount is applied to the resist pattern at the regions to be shrunk and the shrinkage rate of the resist pattern is adjusted such that the resist pattern is shrunk to a desired dimension. Conversely, control may be carried out such that the second exposure amount is applied to the resist pattern at the regions to be shrunk such that shrinkage of the resist pattern is suppressed.

DESCRIPTION OF THE PREFERRED EMBODIMENTS

Embodiments of the present invention will be described hereinafter with reference to FIGS. 1A through 4. In the embodiments, the method of forming a resist pattern and the exposure device of the present invention are applied to a case in which a KrF excimer laser is used as the light source, and a contact hole pattern of a resist is formed by using as the resist TDUR-P015 (manufactured by Tokyo Ohka Kogyo Co., Ltd.), which is a type of resist used with UV light and is a chemically-amplified positive resist used with KrF lasers.

First Embodiment

Figure 1A:
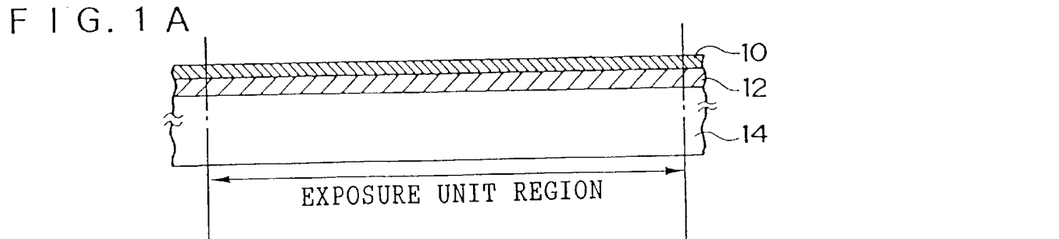
FIGS. 1A–1E illustrate a flow of processing of a method of forming a resist pattern of a first embodiment of the present invention.

First, as illustrated in FIG. 1A, a silicon dioxide film ($SiO_2$ film) 12, which is a film to be processed and is the object of etching, is formed on the surface of a wafer (substrate). TDUR-P015 is coated onto the surface of the $SiO_2$ film 12 to a film thickness of, for example, about 1.0 $\mu$m, to form a resist film 10.

Figure 1B:
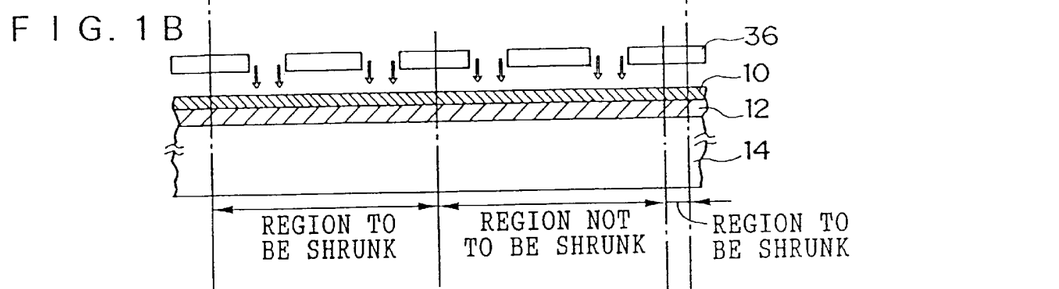
Figure 2:
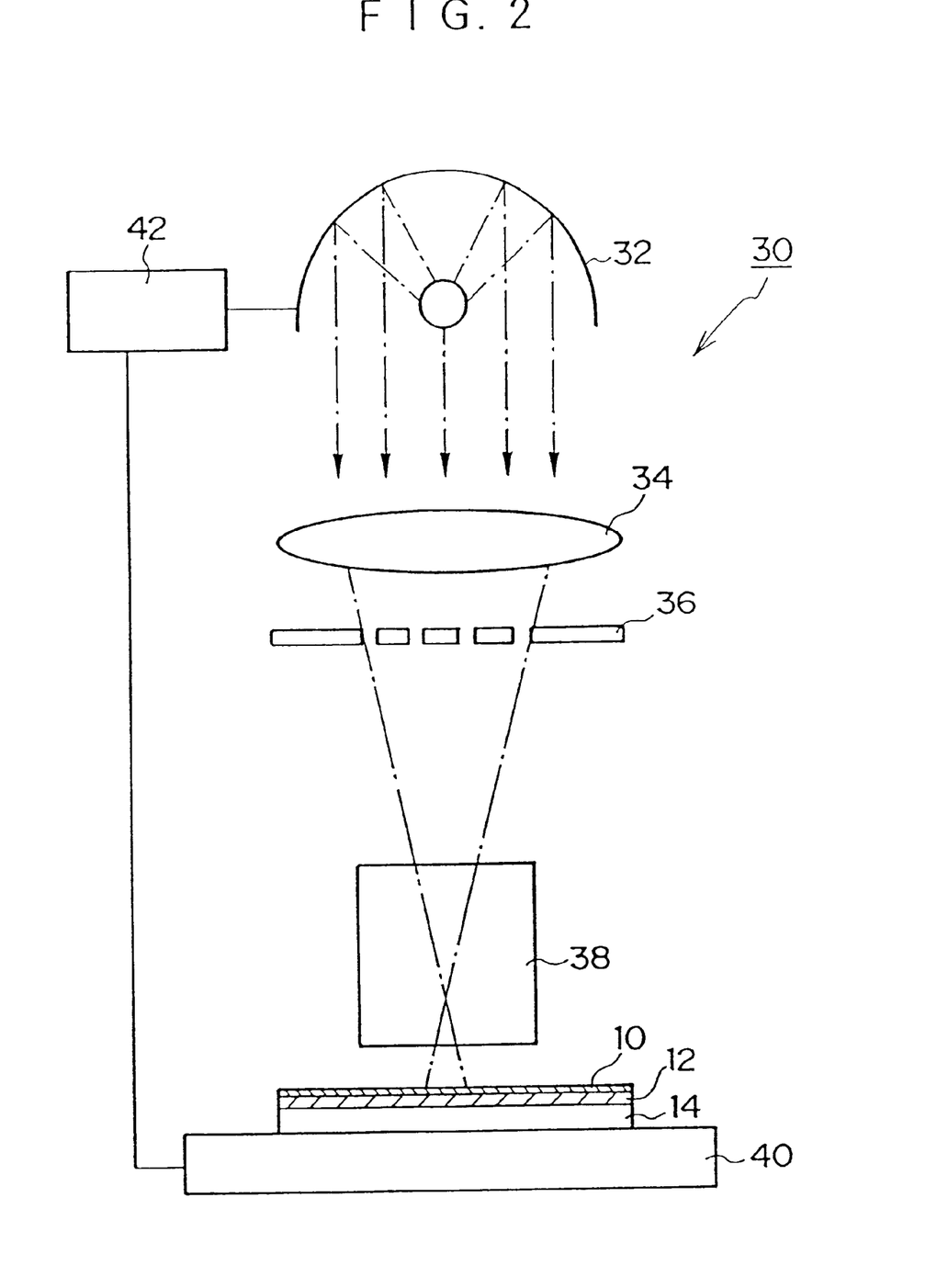
FIG. 2 is a diagram for explaining the schematic structure of a stepper used in the first embodiment.

Next, by using a stepper 30 structured as illustrated in FIG. 2 (a stepping projection aligner; see FIG. 2; details to be described later), pattern exposure is carried out as shown in FIG. 1B per exposure unit region by using deep UV light of a wavelength of, for example, 248 nm. At this time, a pattern is exposed on the resist film 10 at the regions to be shrunk, which pattern is of a dimension which is larger, in accordance with the shrinkage rate, than the dimension of the pattern which is finally necessary. For example, a circular pattern of around 0.25 $\mu$m is exposed at the regions to be shrunk. Further, a pattern which is of a dimension which is finally required, e.g., a circular pattern of about 0.35 $\mu$m, is exposed at the regions not to be shrunk.

The amount of exposure applied to the resist film 10 at this time is, for example, about 20 $mJ/cm^2$. This exposure amount is an exposure amount which is sufficient to form a pattern at the resist film 10 after development (i.e., is the first exposure amount). Note that in FIG. 1B, for explanation, a first reticle 36 is disposed above the wafer. However, in actuality, the first reticle 36 is disposed between a projection optical system 34 and a demagnification optical system 38 as shown in FIG. 2 which will be described later.

The stepper 30 used in exposure will now be briefly explained with reference to FIG. 2. The stepper 30 is basically formed by a KrF excimer laser light source 32, the projection optical system 34, the first reticle 36, the demagnification optical system 38, an X-Y stage 40, and a control section 42.

The KrF excimer laser light source 32 illuminates deep UV light of a wavelength of, for example, 248 nm at a uniform intensity. The projection optical system 34 guides the UV light from the KrF excimer laser light source 32 such that the UV light is illuminated onto the first reticle 36. In FIG. 2, the projection optical system 34 is illustrated as one lens, but is not limited to one lens and may be formed by plural lenses.

A circuit pattern is formed at the first reticle 36. In the present embodiment, the contact hole pattern of the regions to be shrunk is formed as a contact hole pattern of a dimension which is greater, in accordance with the shrinkage rate, than the dimension which is finally required. The pattern at the regions not to be shrunk is formed as a contact hole pattern of the dimension which is finally required. The first reticle 36 can be changed, and in the present embodiment, a second reticle 37 for a second exposure is used at the time of a second exposure as will be described later.

The demagnification optical system 38 demagnifies the beam size of the UV light, which has passed through the first reticle 36, such that the beam size of the UV light is equal to a dimension of the exposure unit region, and illuminates the UV light onto a wafer disposed on the X-Y stage 40. The X-Y stage 40 is movable in two directions, the X direction and the Y direction which are orthogonal to one another, and is moved on the basis of instructions from the control section 42. When there is an instruction from the control section 42 that exposure has been completed for the exposure unit region which is currently being exposed, the X-Y stage 40 is moved, by a unit which is the length of the exposure unit region, such that UV light from the KrF excimer laser light source 32 is illuminated onto the next exposure unit region. The control section 42 effects on-off control of the KrF excimer laser light source 32 so as to adjust the illumination time of the UV light, and controls the movement of the X-Y stage 40 on the basis of position information from a position detecting sensor (not shown in the drawings).

Figure 1C:
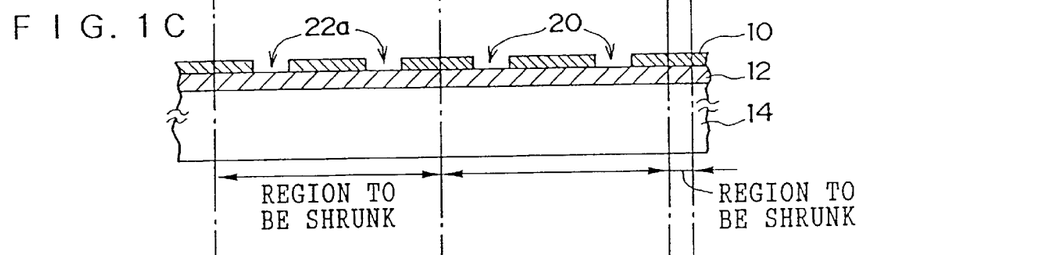

When pattern exposure has been completed for all of the exposure unit regions of the wafer 14 by the stepper 30 structured as described above, the wafer 14 is removed from the stepper 30, and the resist is developed by an alkaline aqueous solution. In this way, the exposed regions of the resist are removed, and as illustrated in FIG. 1C, at the regions to be shrunk, a contact hole pattern 22a is formed which is of a dimension which is larger, in accordance with the shrinkage rate, than the pattern dimension finally necessary (e.g., the contact hole pattern 22a of a diameter of about 0.25 $\mu$m is formed), and at the regions not to be shrunk, a contact hole pattern 20 of a dimension which is finally required (e.g., a diameter of about 0.35 $\mu$m) is formed.

Figure 1D:
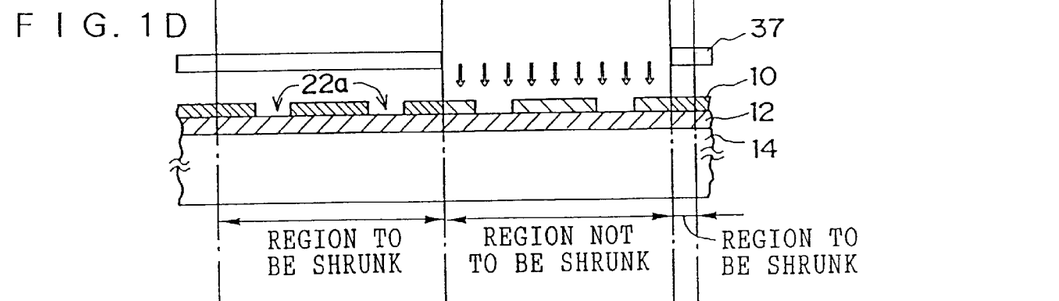

Next, the developed wafer 14 is again set on the stepper 30. In place of the first reticle 36, the second reticle 37 is set at which a pattern is formed such that UV light is illuminated only onto the regions not to be shrunk. Then, as illustrated in FIG. 1D, exposure is carried out by UV light. Here, the exposure amount of the UV light at this time, i.e., the second amount, is an amount (such as, for example, 3.3 m/cm$^2$ or more) which leads to an improvement in the heat resistance of the TDUR-P015 forming the resist film 10 and which does not result in shrinking of the resist pattern after the subsequent high temperature bake processing.

Figure 1E:
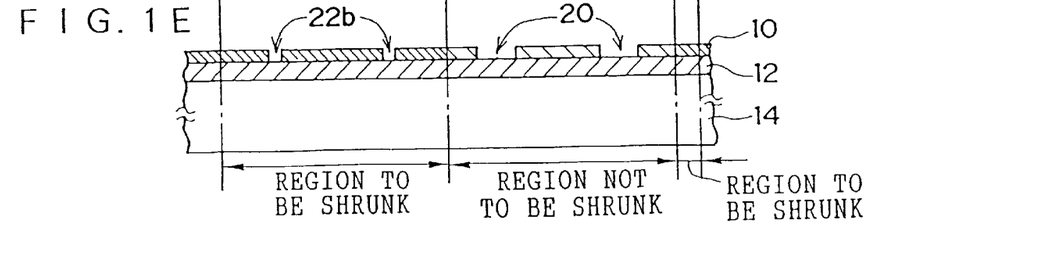

After exposure has been completed, the wafer 14 is removed from the stepper 30 (see FIG. 2), and is subjected to high temperature bake processing at 135° C. for 60 seconds. Due to this high temperature bake processing, for example, as illustrated in FIG. 1E, the contact hole pattern 22a, which has a diameter of about 0.25 $\mu$m and which is formed in the regions to be shrunk to which the second exposure amount is not applied, is shrunk, so as to become a contact hole pattern 22b of a diameter of about 0.1 $\mu$m. The pattern formed at the regions not to be shrunk, at which the second exposure amount is applied, remains as it is as the contact hole pattern 20 of a diameter of 0.35 $\mu$m, without shrinking. The second exposure amount, which provides sufficient heat resistance with respect to temperatures at the time of high temperature bake processing at 135° C. for 60 seconds, is applied to the resist pattern at the regions which are not to be shrunk. Thus, a pattern of dimensions which are substantially the same as those at the time the pattern was exposed, can be obtained.

Figure 3:
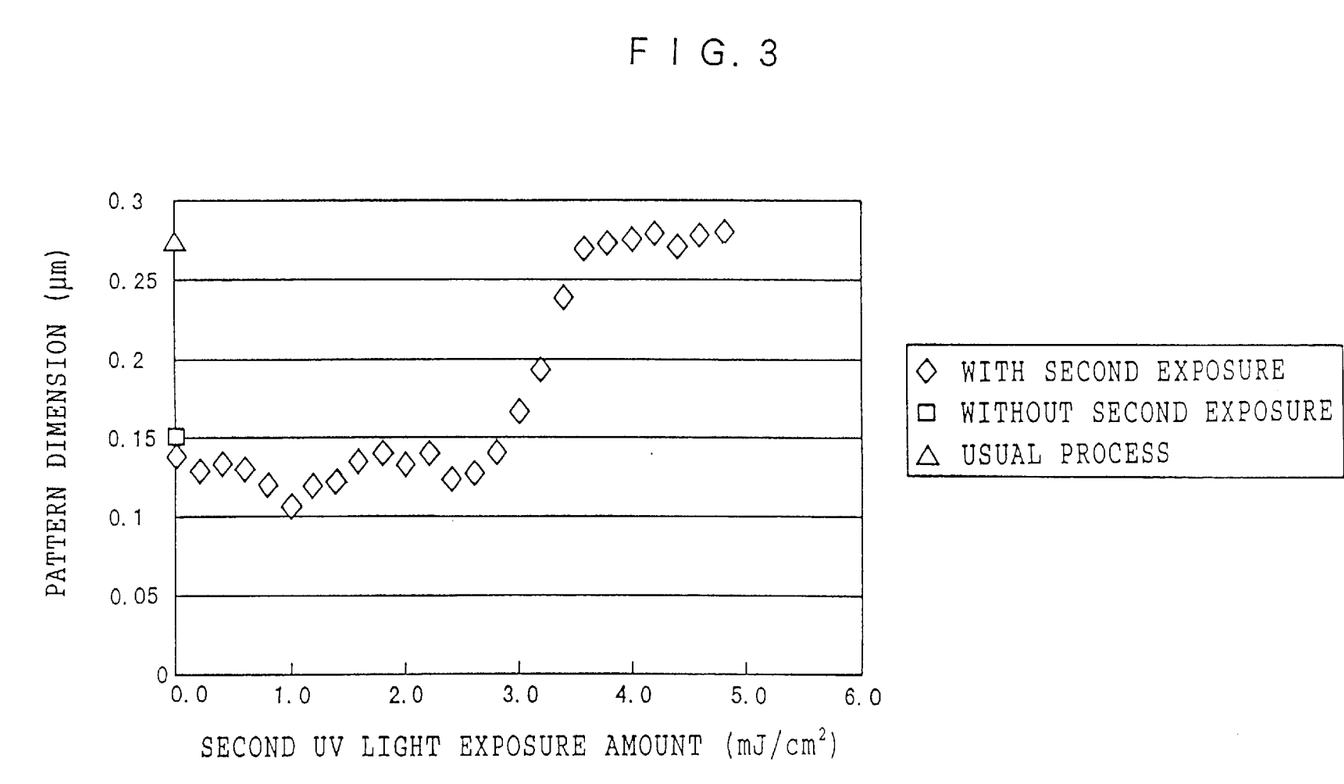
FIG. 3 is a graph illustrating the relationship between a second exposure amount and contact hole pattern shapes after high temperature bake processing at 135° C. for 60 seconds.

Namely, if the TDUR-P015 is used as the resist in the second exposure, as in the first exposure, a contact hole pattern has a different diameter after the high temperature bake processing at 135° C. for 60 seconds at the second exposure amount, as shown by the points represented by the diamonds in the graph of FIG. 3. In other words, when the second exposure amount is greater than or equal to about 3.3 mJ/cm$^2$, the resist pattern has sufficient heat-resistance with respect to temperatures at the time of high temperature bake processing at 135° C. for 60 seconds. Thus, the diameter of the circular pattern, such as the contact hole pattern, is substantially the same as the diameter (the value represented by the triangle in FIG. 3) of a circular pattern which has been obtained by an ordinary process in which regular bake processing is carried out at 90° C. for 60 seconds and the second exposure is not carried out.

On the other hand, when the second exposure amount is less than around 3.3 mJ/cm$^2$, the exposure is insufficient. Thus, the heat resistance with respect to temperatures at the time of high temperature bake processing is insufficient. In other words, when the second exposure amount is from 0 mJ/cm$^2$ to about 2.7 mJ/cm$^2$, the diameter of the circular pattern is substantially the same as the diameter (the value denoted by the square in FIG. 3) of a circular pattern obtained by a process in which high temperature bake processing is carried out at 135° C. for 60 seconds without applying the second exposure amount. Further, when the second exposure amount is between about 2.7 mJ/cm$^2$ and 3.3 mJ/cm$^2$, the heat resistance increases substantially proportionally to the second exposure amount. Thus, the shrinkage rate decreases substantially proportionally, and the diameter of the circular pattern which is finally obtained increases proportionally to the magnitude of the second exposure amount which is applied.

It suffices for the second exposure amount to be applied to a relatively large region. There is no need for the second exposure amount to be applied by using a high resolution exposure device such as the stepper 30 used at the time of pattern exposure. As a result, the second exposure can be carried out by a relatively lower resolution exposure device which is other than the stepper 30 which carries out the pattern exposure.

Namely, an exposure device equipped with a KrF excimer laser is a relatively new exposure device, and the number of such devices which are available is limited due to the cost thereof and the like. Accordingly, such devices have the highest frequency of usage. Thus, by using the exposure device equipped with a KrF excimer laser for pattern exposure and by applying the second exposure amount by using an exposure device of a different type which is not used frequently, the load on the exposure device having the high frequency of usage can be decreased, and efficient processing can be realized.

The light source of the exposure device used at this time may be any light source which illuminates light to which the resist is photosensitive, and may be different than the light source for pattern exposure. For example, the aforementioned TDUR-P015 is photosensitive even to i-line beams, and thus, the second exposure amount may be applied by an exposure device which illuminates i-line beams. Further, the light source does not have to be a light source of a single wavelength used in pattern exposure, and may be a light source which illuminates light in a wide wavelength band including the single wavelength region used for pattern exposure.

In the present embodiment, a case is explained in which TDUR-P015 is used as the material forming the resist film 10. However, the resist film 10 is not limited to TDUR-P015, and other types of resists may be used provided that the resist has the property that the heat resistance thereof improves due to the application of the second exposure amount. Examples of such other resists include TDUR-P007 (manufactured by Tokyo Ohka Kogyo Co., Ltd.), TDUR-P422 (manufactured by Tokyo Ohka Kogyo Co., Ltd.), SEPR402R (manufactured by Shin-Etsu Chemical Co., Ltd.), DX3200P (manufactured by Clariant Japan K.K.), and the like.

The shrinkage rate of the pattern corresponding to the second exposure amount differs in accordance with the type of resist that is used. In this case, the second exposure amount should be adjusted to become the optimal UV light exposure amount on the basis of relationships between respective UV light exposure amounts and shrinkage rates.

In this way, in the present first embodiment, contact hole patterns of different diameters can be formed simultaneously without the patterns deteriorating. For example, a contact hole pattern of a dimension smaller than the resolution limit (such as a contact hole pattern of a diameter of about 0.2 $\mu$m to a diameter of about 0.05 $\mu$m) and a contact hole pattern of a dimension which is larger than the resolution limit and which can be sufficiently formed by a conventional exposure technique (such as a contact hole pattern of a diameter of about 0.2 $\mu$m or more) can be formed simultaneously.

Second Embodiment

As described above in the explanation of FIG. 3, the heat resistance of the TDUR-P015 used as the resist in the first embodiment increases substantially proportionally when the second exposure amount is between about 2.7 mJ/cm$^2$ and 3.3 mJ/cm$^2$. Thus, the shrinkage rate decreases substantially proportionally to the second exposure amount, and the diameter of the circular pattern which is finally obtained increases in proportion to the magnitude of the second exposure amount.

In the present second embodiment, in the above-described first embodiment, after the second exposure amount is applied, a third exposure amount is applied to the entire surface of the wafer substrate. The third exposure amount is greater than or equal to the UV light exposure amount at which the heat resistance begins to change, and is less than or equal to the UV light exposure amount at which the heat resistance is saturated (can be improved no more). The third exposure amount is, for example, from about 2.7 mJ/cm$^2$ to about 3.3 mJ/cm$^2$.

By applying the third exposure amount to the resist at the regions to be shrunk to which the second exposure amount is not applied, the shrinkage rate during the high temperature bake processing can be finely adjusted. Namely, by controlling the third exposure amount within the range of about 2.7 mJ/cm$^2$ to about 3.3 mJ/cm$^2$, the heat resistance, with respect to high temperature bake processing temperatures, of the resist at the regions to be shrunk changes. Thus, the shrinkage rate of the contact hole pattern at the regions to be shrunk after high temperature bake processing can be finely adjusted.

The second exposure amount is applied to the regions not be shrunk such that the pattern at the regions not to be shrunk is not shrunk during high temperature bake processing. Thus, even if the third exposure amount is applied to the regions not to be shrunk, the pattern does not shrink, just as it does not shrink during the high temperature bake processing. Accordingly, when applying the third exposure amount, there is no need to use a reticle, at which a pattern is formed, in order to cover the regions not to be shrunk.

As illustrated in FIG. 3, for example, the relationship between the UV light exposure amount and the dimensions to be finally obtained or the shrinkage rate of the pattern is investigated in advance, and the third exposure amount is determined on the basis of the obtained relationship such that the pattern dimension which is ultimately required can be obtained.

Here, for example, after a third exposure amount of 2.8 mJ/cm$^2$ is applied to the resist pattern, high temperature bake processing at 135° C. for 60 seconds is carried out. Due to this high temperature bake processing, the pattern formed at the regions not to be shrunk does not shrink, and the contact hole pattern 20 of the diameter of about 0.35 $\mu$m remains as it is. However, the amount of shrinkage of the contact hole pattern of the diameter of about 0.25 $\mu$m formed at the regions to be shrunk is slightly less than in the previously-described first embodiment, such that, for example, a contact hole pattern of a diameter of about 0.15 $\mu$m is obtained. Note that other processes are the same as those of the first embodiment, and description thereof will therefore be omitted.

In this way, in accordance with the present second embodiment, contact hole patterns of different diameters can be formed well simultaneously without deterioration of the patterns, and also, can be reliably formed at the desired dimensions. In particular, a small contact hole pattern of a dimension which is less than or equal to the resolution limit and a contact hole pattern of a large dimension which is greater than the resolution limit can be formed.

Third Embodiment

Figure 4:
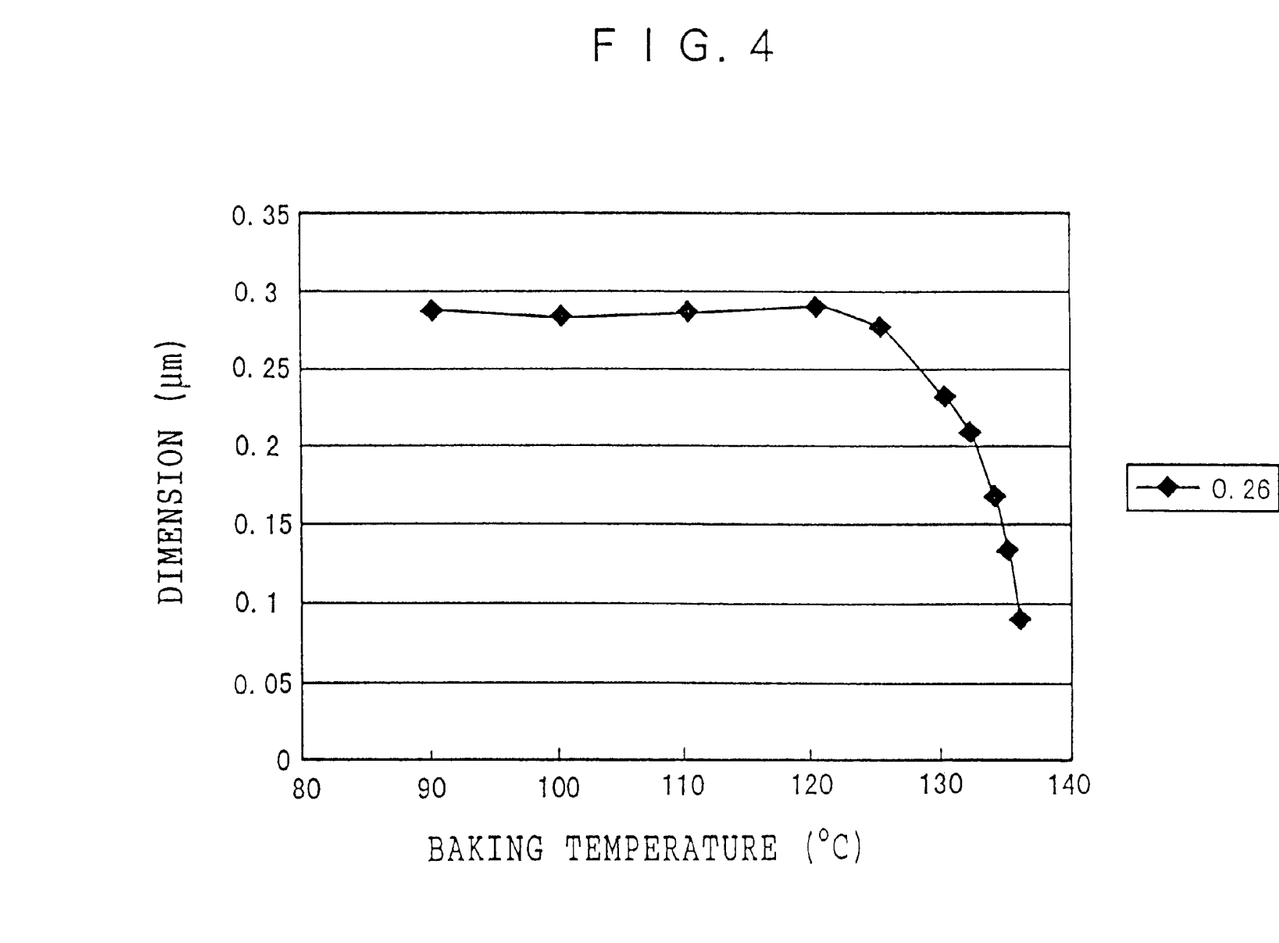
FIG. 4 is a graph illustrating the relationship between baking temperatures and a contact hole pattern diameters.

During the high temperature bake processing, local non-uniformity of temperature may arise at the bake plate such that temperature differences of ±0.5° C. may arise at portions of the surface of the wafer which is disposed on the bake plate. As illustrated in FIG. 4, the shrinkage rate of the resist pattern at the time of high temperature bake processing greatly varies in a vicinity of 130° C. even if the baking temperature varies only by 1° C. Thus, in the high temperature bake processing at 135° C., even in the same pattern, the shrinkage rate may greatly differ depending on the position of the wafer surface. As a result, as shown in FIG. 5, the diameter of the finally obtained contact hole pattern may vary from position to position of the wafer surface.

Figure 5:
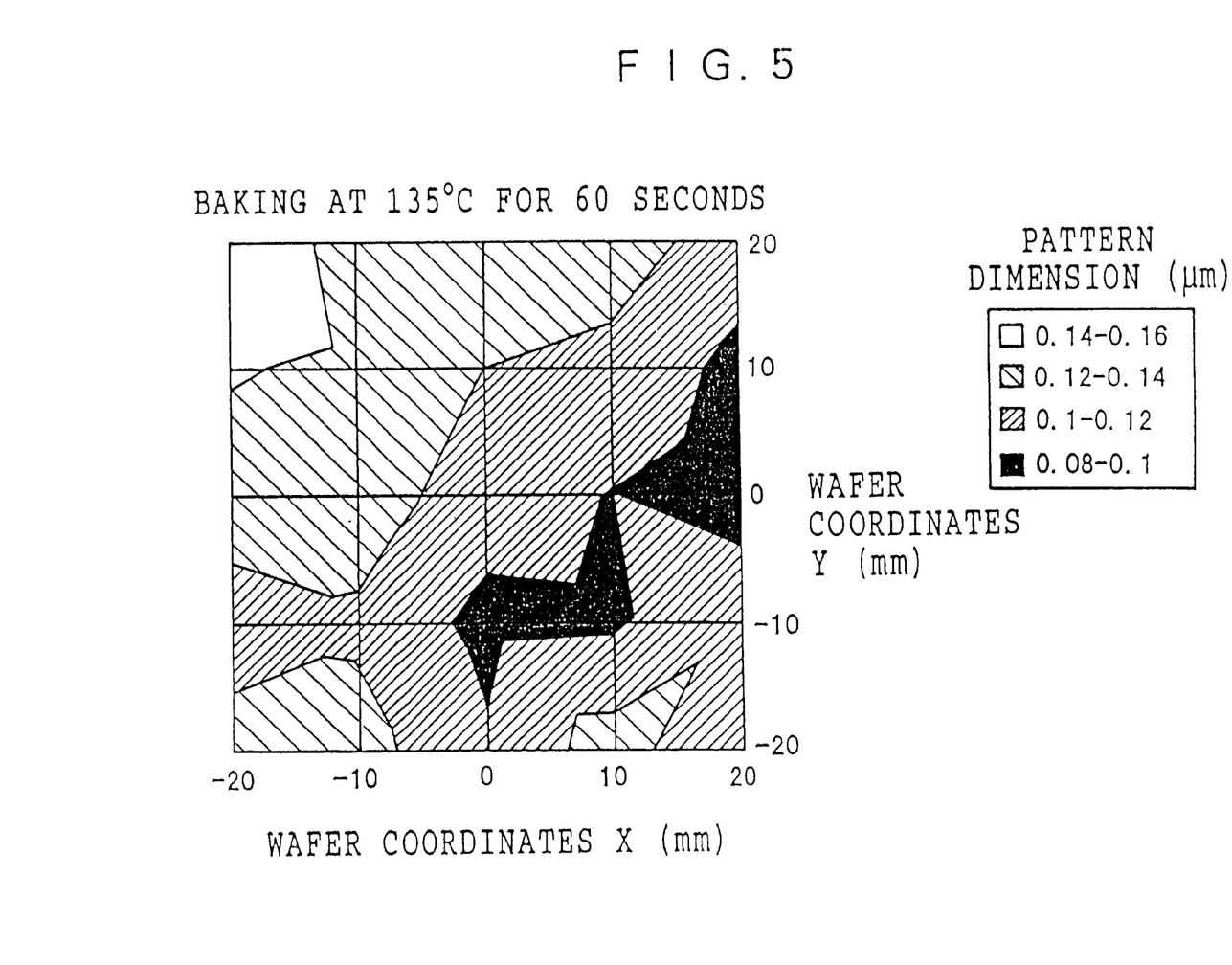
FIG. 5 is a diagram illustrating a contact hole pattern dimension distribution which arises at the time of high temperature bake processing in a square region which is 40 mm by 40 mm and is centered around an origin (0.0) which is a center of a wafer.

As a result, in the present third embodiment, a temperature difference distribution arising at the wafer surface at the time of high temperature bake processing, such as the distribution shown in FIG. 5, is determined in advance. As shown in FIG. 4, the exposure amounts applied to the respective unit regions are corrected so as to offset the errors in the shrinkage rate which arise on the basis of the temperature difference distribution.

Figure 6A:
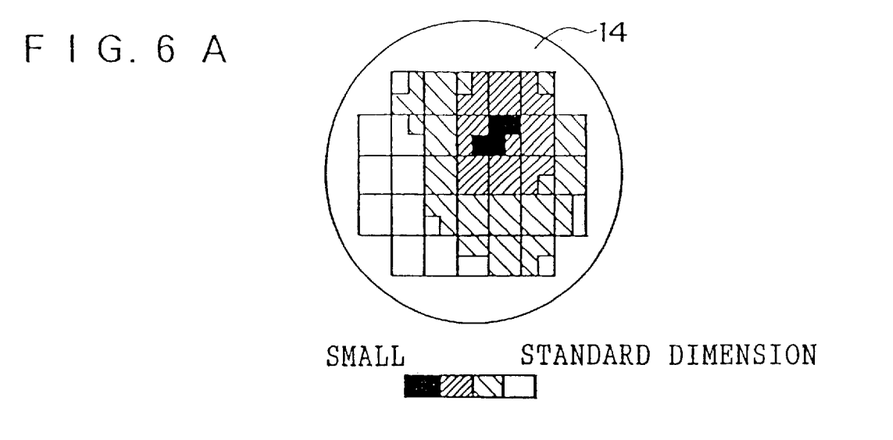
FIG. 6A is a diagram showing a distribution of contact hole pattern dimensions at a wafer surface at the time of high temperature bake processing at 135° C. for 60 seconds.

Namely, as illustrated in FIG. 6A, at the surface of a wafer for which high temperature bake processing at 135° C. for 60 seconds has been completed, there are portions which have shrunk by more than the intended amount of shrinkage, such that regions (the portions indicated by non-dense hatching, the portions indicated by dense hatching, and the black portions) which are smaller than the designed dimensions are formed at portions of the wafer surface. In FIG. 6A, the shrinkage rates among these three types of portions increase in order with the non-densely hatched portions having the lowest shrinkage rate, the densely hatched portions having a higher shrinkage rate, and the black portions having the highest shrinkage rate. The diameter of the formed contact hole pattern becomes smaller in order from the non-densely hatched portions to the densely hatched portions to the black portions.

Figure 6B:
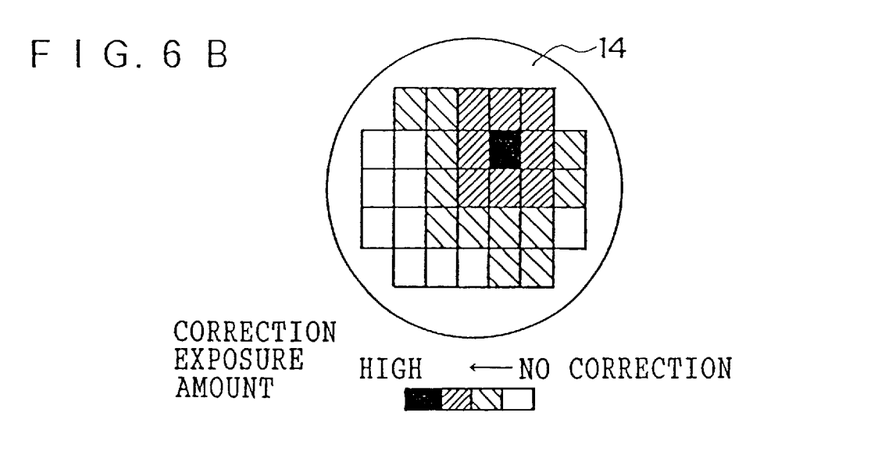
FIG. 6B is a diagram showing a distribution of correction exposure amounts at a wafer surface, as determined on the basis of FIG. 6A.

Accordingly, before high temperature bake processing, as illustrated in FIG. 6B, exposure for correction is carried out. The exposure at this time is carried out per unit exposure region. In correspondence with FIG. 6A, the correction exposure amount becomes greater in order from the non-densely hatched portions to the densely hatched portions to the black portions. The correction amounts at this time are determined on the basis of the amount of change in the shrinkage rate and on the basis of the error temperature with respect to the high temperature baking temperature of the region. Note that there is no need for correction at the regions represented by the white portions, and thus, exposure processing for correction is not carried out at these regions.

Figure 6C:
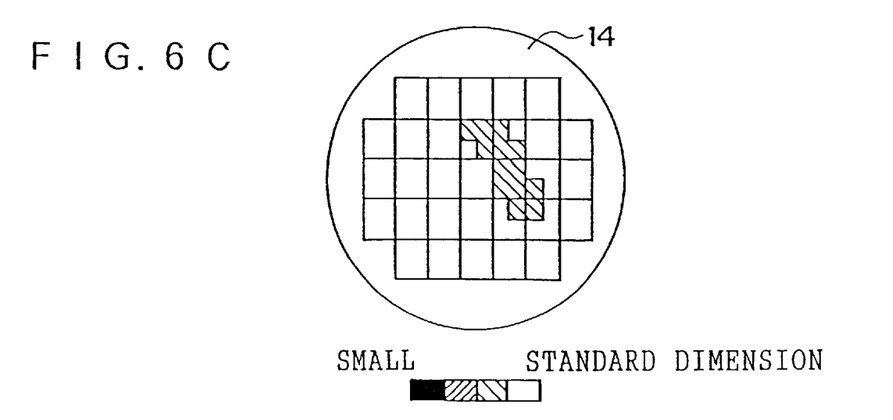
FIG. 6C is a diagram showing a distribution of contact hole pattern dimensions at a wafer surface after the correction exposure amounts in FIG. 6B have been applied and then high temperature bake processing has been carried out.

In this way, after high temperature bake processing has been completed, as illustrated in FIG. 6C, at a single wafer surface, the dimension shrinkage rates become substantially uniform. At a single wafer surface, plural patterns which are substantially in accordance with standard dimensions are obtained. Note that this exposure for correction may be carried out before the pattern exposure or after the contact hole pattern has been formed.

In addition to variations in the high temperature bake processing temperature, variations in the film thicknesses of the respective films forming the laminated layers on the wafer, and the like are causes for variations occurring at the wafer surface. If the relationships between the shrinkage rates and the positions of the wafer, which relationships are based on the variations in the film thicknesses of the respective films (or based on other variations), are determined in advance, the shrinkage rates of the dimensions at a single wafer surface can be made to be substantially uniform in the same way as described above.

In this way, in the present third embodiment, the exposure amount is corrected in accordance with any of various types of variations which occur at the wafer surface. Thus, the shrinkage rate of a pattern of a wafer surface after high temperature bake processing can be made to be substantially uniform, and the uniformity of the dimensions of the pattern can be improved.

Fourth Embodiment

Figure 7:
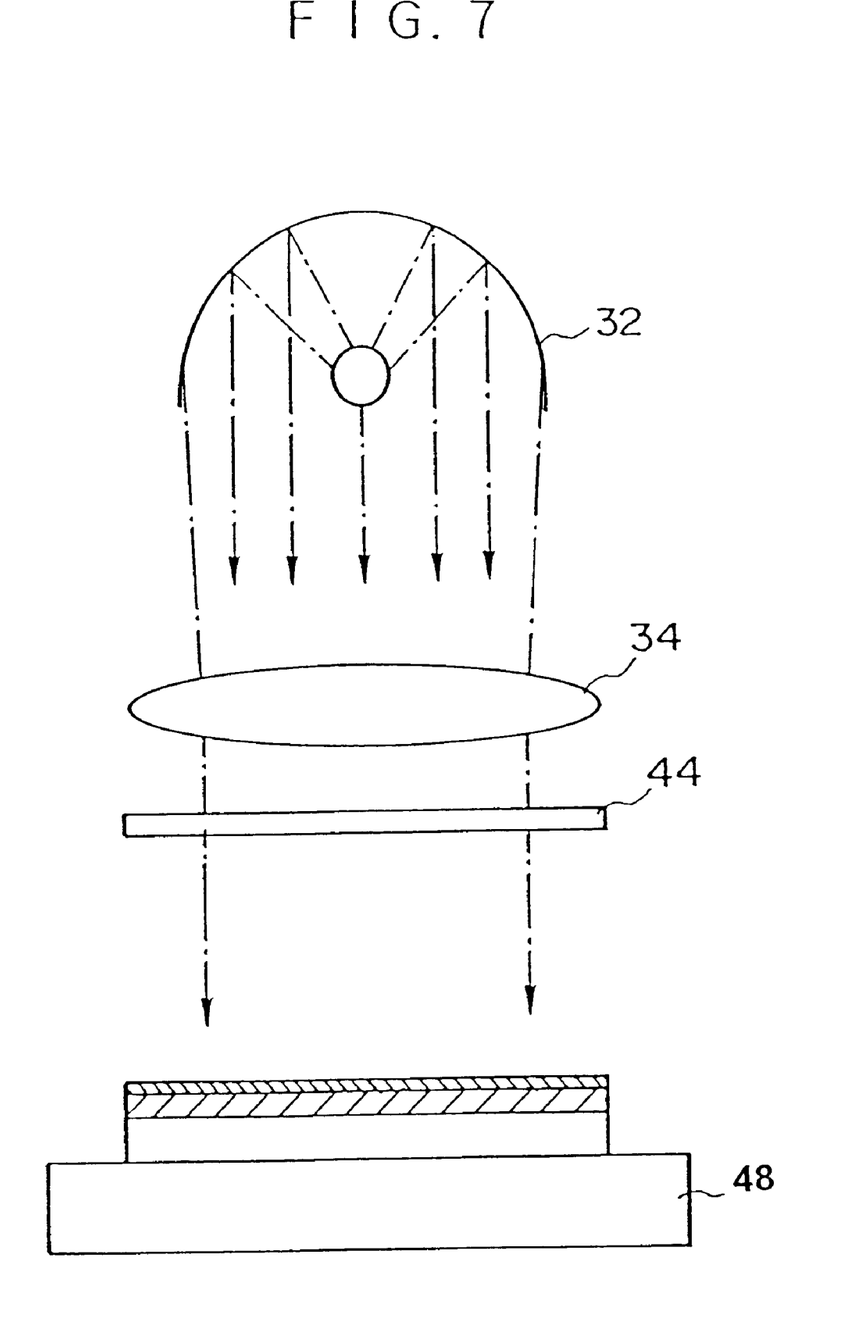
FIG. 7 is a diagram for explanation, and illustrates a schematic structure of a batch exposure device used in a fourth embodiment.

The present fourth embodiment is an application of the third embodiment. The above-described correction is carried out at a batch exposure device structured as shown in FIG. 7. This batch exposure device is structured mainly by the KrF excimer laser light source 32, the projection optical system 34, a filter 44, and a stage 48.

The KrF excimer laser light source 32 illuminates deep UV light of a wavelength of 248 nm at a uniform intensity. The projection optical system 34 guides the UV light from the KrF excimer laser light source 32 such that the light is irradiated onto the filter 44. Note that in FIG. 7, although the projection optical system 34 is illustrated as one lens, the projection optical system 34 is not limited to one lens and may be formed by plural lenses.

Figure 8A:
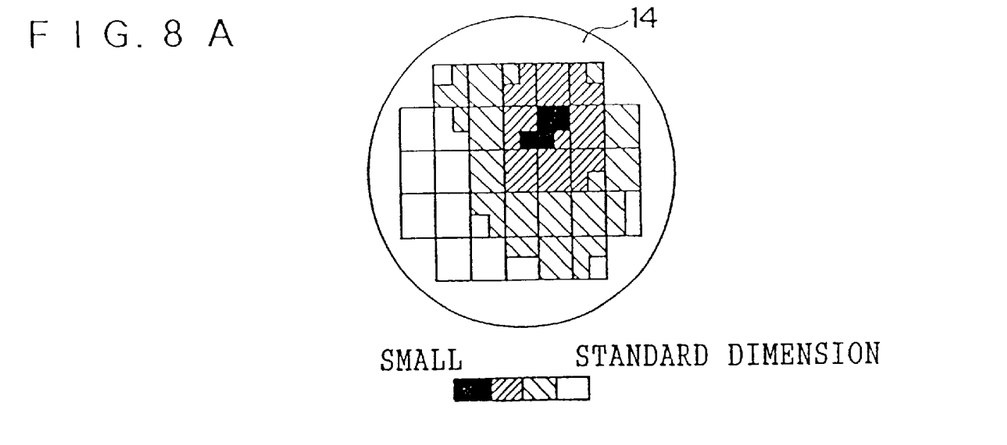
FIG. 8A is a diagram showing a distribution of contact hole pattern dimensions at a wafer surface at the time of high temperature bake processing at 135° C. for 60 seconds.

The filter 44 adjusts the transmission rate per unit region which is smaller than the unit regions forming one chip. Namely, as illustrated in FIG. 8A, at the surface of a wafer for which high temperature bake processing at 135° C. for 60 seconds has been completed, there are portions which have shrunk by more than the intended amount of shrinkage, and regions (the portions indicated by non-dense hatching, the portions indicated by dense hatching, and the black portions in FIG. 8A) which are smaller than the standard dimensions are formed at portions of the wafer surface. In FIG. 8A, the shrinkage rates among these three types of portions increase in order with the non-densely hatched portions having the lowest shrinkage rate, the densely hatched portions having a higher shrinkage rate, and the black portions having the highest shrinkage rate.

Figure 8B:
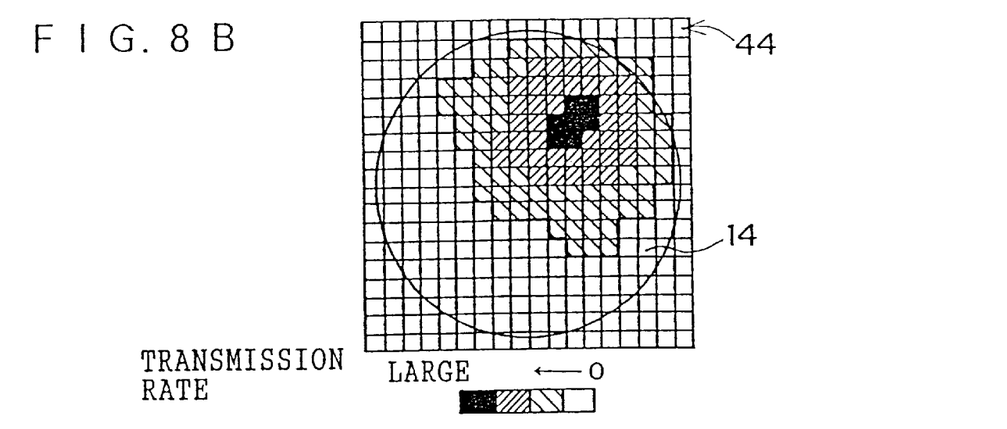
FIG. 8B is a diagram showing a distribution of transmission rates of a filter determined in accordance with correction exposure amounts based on FIG. 8A.

Accordingly, as illustrated in FIG. 8B, the transmission rate of the filter 44 becomes greater in order from the non-densely hatched portions to the densely hatched portions to the black portions. Note that there is no need for correction at the regions represented by the white portions, and thus, light is blocked from reaching these regions.

Figure 8C:
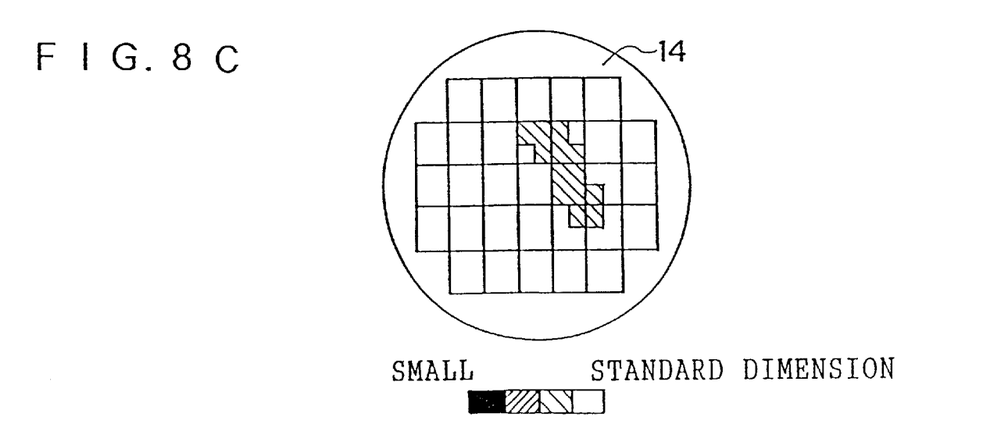
FIG. 8C is a diagram showing a distribution of contact hole pattern dimensions at a wafer surface after correction exposure amounts adjusted by the filter having the distribution of transmission rates of FIG. 8B have been applied and then high temperature bake processing has been carried out.

Exposure for correction is carried out in this way by the filter 44 which adjusts the transmission rate. Thereafter, by carrying out high temperature bake processing at 135° C. for 60 seconds, as illustrated in FIG. 8C, the amounts of shrinkage of the dimensions become substantially uniform at one wafer surface. At a single wafer surface, plural patterns which are substantially in accordance with standard dimensions are obtained. Note that this exposure for correction may be carried out before the pattern exposure or after the contact hole pattern has been formed.

In the batch exposure device of the present fourth embodiment, the KrF excimer laser light source 32 is used for the light source. However, the light source is not limited to the KrF excimer laser light source 32. A light source which is different than that used during pattern exposure may be used, provided that it is a light source which illuminates light to which the resist is photosensitive. In the same way as in the above-described first embodiment, a light source which emits i-line beams, a light source which emits light of a broad wavelength band including the single wavelength region used for pattern exposure, or the like may be used.

By using the batch exposure device structured in this manner, throughput can be greatly improved. Because the structure of the batch exposure device is relatively simple, there is also the advantage that manufacturing of the batch exposure device is inexpensive.

Fifth Embodiment

Figure 9A:
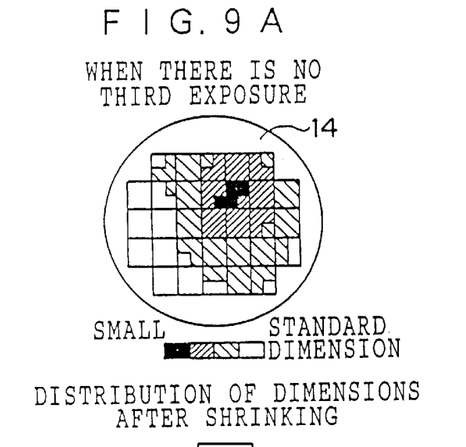
FIG. 9A is a diagram showing a distribution of the dispersion in the shrinkage rate of a resist pattern caused by differences in temperature at a bake plate.
Figure 9B:
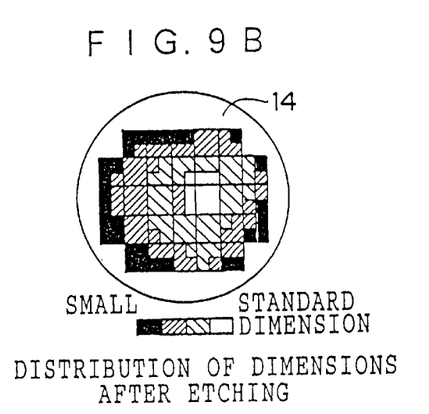
FIG. 9B is a diagram showing a distribution of the dispersion in the pattern dimension at a wafer surface after etching using the resist pattern of FIG. 9A has been carried out.

As illustrated in FIG. 9B, there are cases in which the pattern dimensions of the finally formed $SiO_2$ film 12 (see FIG. 1) greatly vary depending on the position on the surface of a single wafer. Thus, variations are caused by a factor in other processings such as etching processing for etching the underlayer $SiO_2$ film 12 (see FIG. 1) by using the formed resist pattern as a mask.

Accordingly, in the present fifth embodiment, the exposure amounts applied to the respective unit regions are corrected such that variations in the dimensions at the surface of the one wafer to be finally obtained are eliminated.

For example, when a wafer has been subjected to high temperature bake processing without being subjected to exposure for correcting variations in the shrinkage rates caused by temperature differences of the bake plate, regions (the portions indicated by non-dense hatching, the portions indicated by dense hatching, and the black portions) which are smaller than standard dimensions are formed at portions of the wafer surface as illustrated in FIG. 9A. Thereafter, when the underlayer $SiO_2$ film 12 is etched by using the formed resist pattern as a mask, variations in dimensions such as shown in FIG. 9B arise among the dimensions of the finally obtained $SiO_2$ pattern.

Figure 9C:
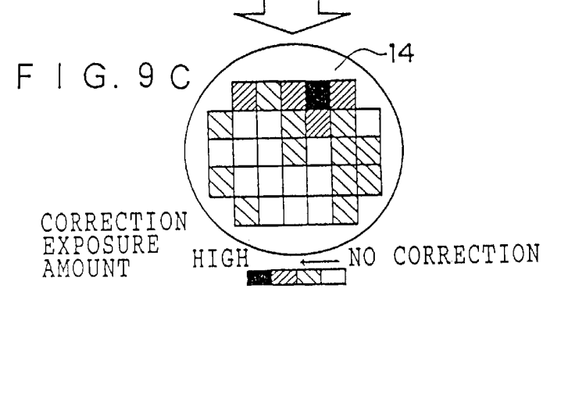
FIG. 9C is a diagram showing a correction exposure amount distribution which has been adjusted such that the dispersion in the dimension at the wafer surface after etching is eliminated.
Figure 9D:
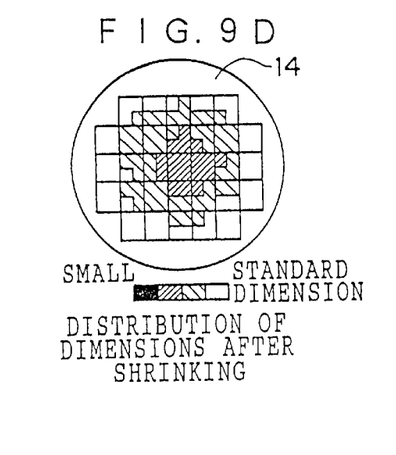
FIG. 9D is a diagram showing a distribution of the dispersion in the shrinkage rate of a resist pattern obtained by the correction exposure amounts of FIG. 9C being applied and then high temperature bake processing being carried out.

In this case, a distribution of variations in the shrinkage rate of the wafer surface is determined (see FIG. 9D) such that the shrinkage distribution after high temperature bake processing offsets the distribution of variations in the final dimensions shown in FIG. 9B. Exposure amounts (FIG. 9C) for correcting the variations in shrinkage rates are determined such that the distribution in variations in the shrinkage rate, which are caused by the differences in the temperature of the bake plate as shown in FIG. 9A, becomes the distribution of variations in the shrinkage rates shown in FIG. 9D.

Figure 9E:
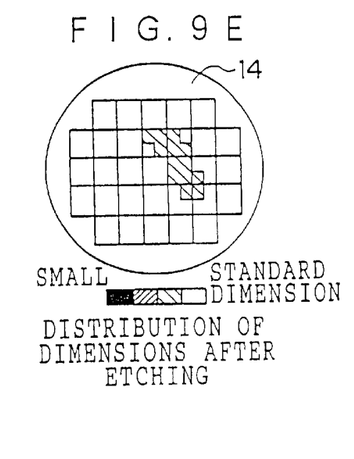
FIG. 9E is a diagram showing a distribution of the dispersion in the pattern dimension arising at a wafer surface after etching by using the resist pattern of FIG. 9D has been carried out.

By adjusting the exposure amounts (FIG. 9C) for correcting the variations in the shrinkage rates in this manner, as shown in FIG. 9E, the shrinkage rates of the dimensions become substantially uniform at a surface of a single wafer for which processing has been completed. At a single wafer surface, plural patterns which are substantially in accordance with standard dimensions are obtained. Note that this exposure for correction may be carried out by the stepper 30 described in the first embodiment, or by the batch exposure device described in the fourth embodiment.

The first through the fifth embodiments have described cases in which the patterns which are formed are all contact hole patterns. However, the present invention is of course applicable to other types of patterns, such as resist patterns at the time of forming an embedded wiring pattern or the like.

In the first through the fifth embodiments, the high temperature bake processing temperature is 135° C. However, the high temperature bake processing temperature is not particularly limited to this temperature, and may be appropriately varied in accordance with the type of the resist or the like. Further, the shrinkage rates of the resist pattern can be adjusted not only by adjusting at least one of the second exposure amount and the third exposure amount, but also by adjusting the high temperature bake processing temperature. Thus, the high temperature bake processing temperature can be varied in order to control the shrinkage rates of the resist pattern. The shrinkage rates can be adjusted even more precisely by controlling both the adjustment of at least one of the second exposure amount and the third exposure amount, and the adjustment of the high temperature bake processing temperature.

In the first through the fifth embodiments, cases are described in which exposure is carried out by using a KrF excimer laser light source. However, if the resist, which is selected in accordance with the type of exposure light to be used, has the property that the heat resistance thereof with respect to the baking temperature can be varied in accordance with the exposure amount, exposure can be carried out by, for example, using an ArF excimer laser light source.

The sizes of the contact hole patterns in the first through fifth embodiments are all examples, and the present invention is not limited to these sizes. The size of the contact hole pattern can be selected appropriately in accordance with the object. Further, the shrinkage rates of the contact hole patterns are also examples, and are of course values which vary in accordance with the type of the resist that is used.

As described above, the present invention has following effects.

Both a pattern of a relatively large dimension which is greater than or equal to the resolution limit, and a pattern of a relatively fine dimension which is less than or equal to the resolution limit, can be formed simultaneously. Further, a resist pattern which is formed well without deterioration of the configuration thereof can be obtained.

The shrinkage rates at the surface of one wafer can be made to be substantially the same, even when there are differences in temperature at the surface of one wafer caused by the heating state or the like of a heating body such as a bake plate at the time of high temperature bake processing.

The shrinkage rates at the surface of one wafer can be made to be substantially the same by correcting variations in dimensions which occur at the surface of the one wafer due to processes other than the high temperature bake processing.

The shrinkage rate of the pattern at the time of high temperature baking can be adjusted even more precisely.

The exposure device has a relatively simple structure, and the costs for manufacturing the exposure device are low. In addition, the exposure device can carry out the second exposure, the third exposure, and the exposure for correction. Thus, the load on an exposure device, which has a KrF excimer laser as the light source and which has a high frequency of usage, can be decreased.

What is claimed is:

1. A method of forming a resist pattern, comprising the steps of:
   (a) applying a resist to an object surface;
   (b) subjecting the resist to pattern exposure by irradiating the resist with light directed through a first reticle;
   (c) developing the resist, wherein the developed resist pattern has first regions not to be shrunk in which a plurality of patterns having intervals that are smaller than a predetermined distance are provided, and second regions to be shrunk at a predetermined shrinkage rate in which a plurality of patterns having intervals that are larger than a predetermined distance are provided;
   (d) providing the first regions not to be shrunk with resistance to shrinkage during a bake process by irradiating the resist with light directed through a second reticle, the light only reaching said first regions;
   (e) adjusting a shrinkage rate of the resist pattern by irradiating the entire resist with light; and
   (f) baking the resist.

2. The method of claim 1, wherein the step of adjusting a shrinkage rate includes irradiating areas of the resist with light of at least 2.7 mJ/cm$^2$.

3. The method of claim 1, wherein the step of adjusting a shrinkage rate includes irradiating areas of the resist with light of at least 3.3 mJ/cm$^2$.

4. The method of claim 1, wherein the step of adjusting a shrinkage rate includes providing the second reticle for passing light therethrough for exposing areas of the resist which are not to be shrunk.

5. The method of claim 1, further comprising the step of irradiating the resist with light in an amount from 2.7 to 3.3 mJ/cm$^2$.

6. The method of claim 5, wherein the step of irradiating the resist with light in the amount from 2.7 to 3.3 mJ/cm$^2$ includes irradiating areas of the resist in accordance with temperature differentials that arise in the resist during the step of baking.

7. A method of forming a resist pattern comprising the steps of:
   subjecting a resist, which is applied on a surface of an object to be processed, to pattern exposure in which a first exposure amount for forming a pattern is applied to the resist;
   forming a resist pattern by developing the resist, wherein the resist pattern has first regions not to be shrunk in which a plurality of patterns having intervals that are smaller than a predetermined distance are provided, and second regions to be shrunk at a predetermined shrinkage rate in which a plurality of patterns having intervals that are larger than a predetermined distance are provided;
   applying a second exposure amount to the first regions not to be shrunk, providing the first regions of the resist pattern not to be shrunk with resistance to shrinkage during a bake process;
   applying a third exposure amount, which adjusts a shrinkage rate of the resist pattern, to the resist pattern thereby exposing the second regions to be shrunk to the third exposure amount corresponding to the predetermined shrinkage rate; and subjecting the resist to a bake process at a temperature at which the resist flows, thereby shrinking the second regions to be shrunk.

8. The method of forming a resist pattern of claim 7, wherein the second exposure amount is an exposure amount at least equal to a saturation exposure amount of the resist.

9. The method of forming a resist pattern of claim 7, further comprising the step of:

adjusting the third exposure amount for each of predetermined regions of the object to be processed in accordance with shrinkage rate differentials due to a distribution of temperatures arising during the step of subjecting the resist to a bake process.

10. The method of forming a resist pattern of claim 9, wherein the step of adjusting the third exposure amount is carried out at the time of third exposure by adding a correction amount to a pre-correction second exposure amount.

11. The method of forming a resist pattern of claim 9, wherein the step of adjusting the third exposure amount is carried out by performing an additional exposure at an exposure amount corresponding to a correction amount, after the third exposure has been carried out at a pre-correction third exposure amount.

12. The method of forming a resist pattern of claim 7, further comprising the step of:

correcting the third exposure amount for each of predetermined regions of the object to be processed for eliminating a distribution of errors in shrinkage rates of a pattern to finally be formed on the object.

13. The method of forming a resist pattern of claim 12, wherein the step of adjusting the third exposure amount is carried out at the time of third exposure by adding a correction amount to a pre-correction third exposure amount.

14. The method of forming a resist pattern of claim 12, wherein the step of adjusting the third exposure amount is carried out by performing an additional exposure at an exposure amount corresponding to a correction amount, after the third exposure has been carried out at a pre-correction third exposure amount.

15. The method of forming a resist pattern of claim 7, wherein the resist is a resist for use with UV light, and exposures are performed using UV light.

16. The method of forming a resist pattern of claim 7, further comprising the step of:

adjusting the shrinkage rate of the resist pattern by adjusting bake temperature while subjecting the resist to the bake process.

17. A method of forming a resist pattern comprising the steps of:

subjecting a resist, which is applied on a surface of an object to be processed, to pattern exposure in which a first exposure amount for forming a pattern is applied to the resist;

forming a resist pattern by developing the resist, wherein the resist pattern has first regions not to be shrunk in which a plurality of patterns having contact holes whose diameters are smaller than a predetermined distance are provided, and second regions to be shrunk at a predetermined shrinkage rate in which a plurality of patterns having contact holes whose diameters are larger than a predetermined distance are provided;

applying a second exposure amount to the first regions not to be shrunk, providing the first regions of the resist pattern not to be shrunk with resistance to shrinkage during a bake process;

applying a third exposure amount, which adjusts a shrinkage rate of the resist pattern, to the resist pattern thereby exposing the second regions to be shrunk to the third exposure amount corresponding to the predetermined shrinkage rate; and subjecting the resist to a bake process at a temperature at which the resist flows, thereby shrinking the second regions to be shrunk.

18. The method of claim 17, wherein said predetermined distance is 0.5 $\mu$m.

19. A method of forming a resist pattern, comprising the steps of:

(a) applying a resist to an object surface;

(b) subjecting the resist to pattern exposure by irradiating the resist with light directed through a first reticle;

(c) developing the resist, wherein the developed resist pattern has first regions not to be shrunk in which a plurality of patterns having contact holes whose diameters are smaller than a predetermined distance are provided, and second regions to be shrunk at a predetermined shrinkage rate in which a plurality of patterns having contact holes whose diameters are larger than a predetermined distance are provided;

(d) providing the first regions not to be shrunk with resistance to shrinkage during a bake process by irradiating the resist with light directed through a second reticle, the light only reaching said first regions;

(e) adjusting a shrinkage rate of the resist pattern by irradiating the entire resist with light; and (f) baking the resist.

20. The method of claim 19, wherein said predetermined distance is 0.5 $\mu$m.

* * * * *